US008587028B2

United States Patent
Simin et al.

(10) Patent No.: US 8,587,028 B2
(45) Date of Patent: Nov. 19, 2013

(54) GATELESS SWITCH WITH CAPACITIVELY-COUPLED CONTACTS

(75) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 844 days.

(21) Appl. No.: 12/651,470

(22) Filed: Jan. 3, 2010

(65) Prior Publication Data
US 2010/0175979 A1 Jul. 15, 2010

Related U.S. Application Data

(60) Provisional application No. 61/204,368, filed on Jan. 6, 2009.

(51) Int. Cl.
*H01L 29/66* (2006.01)
(52) U.S. Cl.
USPC ............... 257/192; 257/288; 257/E29.325
(58) Field of Classification Search
None
See application file for complete search history.

(56) References Cited

U.S. PATENT DOCUMENTS

2007/0114568 A1* 5/2007 Simin et al. ............ 257/192

OTHER PUBLICATIONS

Koudymov et al., "HfO2-III-Nitride RF Switch With Capacitively Coupled Contacts", IEEE Electron Device Letters, vol. 30, No. 5, pp. 478-480, May 2009.
Simin et al, "High-Power RF Switching Using III-Nitride Metal-Oxide-Semiconductor Heterojunction Capacitors", IEEE Electron Device Letters, vol. 26, No. 2, pp. 56-58, Feb. 2005.
Koudymov et al., "Monolithically Integrated High-Power Broad-Band RF Switch Based on III-N Insulated Gate Transistors", IEEE Microwave and Wireless Components Letters, vol. 14, No. 12, pp. 560-562, Dec. 2004.
Yang et al., "High-Power Operation of III-N MOSHFET RF Switches", IEEE Microwave and Wireless Components Letters, vol. 15, No. 12, pp. 850-852, Dec. 2005.
Simin et al., "III-Nitride Transistors with Capacitively Coupled Contacts", Applied Physics Letters 89, pp. 1-3, 2006.
Simin et al., "RF-Enhanced Contacts to Wide-Bandgap Devices", IEEE Electron Device Letters, vol. 28, No. 1, pp. 2-4, Jan. 2007.
Simin et al., "High-power III-Nitride Integrated Microwave Switch with Capacitively-Coupled Contacts", IEEE/MTT-S, International Microwave Symposium, pp. 457-460, 2007.

* cited by examiner

*Primary Examiner* — Benjamin Sandvik
*Assistant Examiner* — Leslie Pilar Cruz
(74) *Attorney, Agent, or Firm* — LaBatt, LLC (57) ABSTRACT

A switch includes an input contact and an output contact to a conducting channel. At least one of the input and output contacts is capacitively coupled to the conducting channel. A control contact is located outside of a region between the input and output contacts, and can be used to adjust the switch between on and off operating states. The switch can be implemented as a radio frequency switch in a circuit.

20 Claims, 8 Drawing Sheets

FIG. 1

GATELESS SWITCH WITH CAPACITIVELY-COUPLED CONTACTS

REFERENCE TO PRIOR APPLICATIONS

The current application claims the benefit of co-pending U.S. Provisional Application No. 61/204,368, titled "Gateless radio-frequency switch with capacitively-coupled contacts," which was filed on 6 Jan. 2009, and which is hereby incorporated by reference.

GOVERNMENT LICENSE RIGHTS

The U.S. Government has a paid-up license in this invention and the right in limited circumstances to require the patent owner to license others on reasonable terms as provided for by the terms of contract no. FA8650-09-C-7931 awarded by the United States Air Force (USAF)/Air Force Material Command (AFMC).

TECHNICAL FIELD

The disclosure relates generally to switches, and more particularly, to a gateless switch with capacitively-coupled contacts.

BACKGROUND ART

Solid state radio frequency (RF) switches are important components of Radar transmit/receive (T/R) modules, satellite communication systems, Joint Tactical Radio Systems (JTRS), and the like. A promising RF switch technology uses Heterostructure Field Effect Transistors (HFETs). Recently, high power switches made of AlGaN/GaN HFETs demonstrated superior performance over other RF switching devices in terms of maximum power density, bandwidth, operating temperature, and breakdown voltage.

Many applications, including JTRS and low-noise receivers, require RF switches with a very low insertion loss, e.g., typically below 0.3 decibels (dB). A low loss switch dissipates little RF power. As a result, it can be fabricated over a low cost substrate, such as sapphire. Low insertion loss in an HFET is due to a high channel conductance of the device, which is proportional to a total length of the device periphery. Exceptionally high 2D electron gas densities at the AlGaN/GaN interface make a group III-Nitride HFET with a total periphery of two to five mm an ideal candidate for RF switching applications.

The feasibility of high-power broad-band monolithically integrated group III-Nitride HFET RF switches has been demonstrated. Large signal analysis and experimental data for a large periphery group III-Nitride switch indicate that the switch can achieve switching powers exceeding +40 to +50 dBm.

Quality ohmic contact formation is a significant problem in the manufacture of wide band gap semiconductor devices. In particular, high temperature annealing (e.g., at 850-900 degrees Celsius) leads to material degradation during post-growth processing in the manufacturing process. For operating frequencies in the gigahertz range, group III-Nitride-based RF switches can be manufactured using capacitively-coupled contacts. The manufacture of such capacitively-coupled contacts can be performed using a self-aligned metallization process that does not require contact annealing. This process provides a reduction in material degradation and simultaneous formation of RF input, output and control electrodes. RF switches with capacitively-coupled contacts can be manufactured using either Schottky electrodes deposited over a wide band gap barrier layer or metal-oxide-semiconductor (MOS) structures with electrodes formed over oxide-semiconductor heterojunction films.

The resulting RF switch with capacitively-coupled contacts can comprise a very low contact resistance at RF frequencies, particularly frequencies of approximately two gigahertz and above. Additionally, such group III-Nitride switches have been shown to be capable of low-loss high power RF switching. For example, a group-III Nitride RF switch with capacitively-coupled contacts has provided insertion loss below one decibel with isolation of thirty decibels in the frequency range of one to eleven gigahertz.

SUMMARY OF THE INVENTION

Aspects of the invention provide a switch, which includes an input contact and an output contact to a conducting channel. At least one of the input and output contacts is capacitively coupled to the conducting channel. A control contact is located outside of a region between the input and output contacts, and can be used to adjust the switch between on and off operating states. The switch can be implemented as a radio frequency switch in a circuit.

A first aspect of the invention provides a switch comprising: a conducting channel; an input contact to the conducting channel; an output contact to the conducting channel, wherein the input contact and the output contact form opposing sides of an input-output region, and wherein at least one of the input contact or the output contact is capacitively coupled to the conducting channel; and at least one control contact located outside of the input-output region.

A second aspect of the invention provides a circuit comprising: a radio frequency (RF) switch including: a conducting channel; an input contact to the conducting channel; an output contact to the conducting channel, wherein the input contact and the output contact form opposing sides of an input-output region, and wherein at least one of the input contact or the output contact is capacitively coupled to the conducting channel; and at least one control contact located outside of the input-output region; a RF source electrically connected to the input contact; a RF output electrically connected to the output contact; and a RF control circuit electrically connected to the at least one control contact.

A third aspect of the invention provides a switch comprising: a barrier layer comprising a wide band gap; and a buffer layer comprising a band gap narrower than the barrier layer, wherein a conducting channel is formed at an interface of the barrier layer and the buffer layer; an input contact to the conducting channel; an output contact to the conducting channel, wherein the input contact and the output contact form opposing sides of an input-output region, wherein the input contact and the output contact are located over the barrier layer, and wherein the input contact and the output contact are capacitively coupled to the conducting channel; and at least one control contact located outside of the input-output region.

Other aspects of the invention provide circuits, devices, and methods of designing, using and generating each, which include and/or utilize some or all of the switches and circuits described herein. The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a switch, which includes an input contact and an output contact to a conducting channel. At least one of the input and output contacts is capacitively coupled to the conducting channel. A control contact is located outside of a region between the input and output contacts, and can be used to adjust the switch between on and off operating states. The switch can be implemented as a radio frequency (RF) switch in a circuit. The absence of the control contact in the RF input-RF output spacing can simplify fabrication of the switch, increase an operating voltage for the switch, and/or reduce an off state device capacitance. It is understood that for the purposes of the present invention, Al means Aluminum, As means Arsenic, C means Carbon, In means Indium, Ga means Gallium, Hf means Hafnium, N means Nitrogen, O means Oxygen, P means Phosphorous, and Si means Silicon. As used herein, unless otherwise noted, the term "set" means one or more (i.e., at least one) and the phrase "any solution" means any now known or later developed solution.

Figure 1:
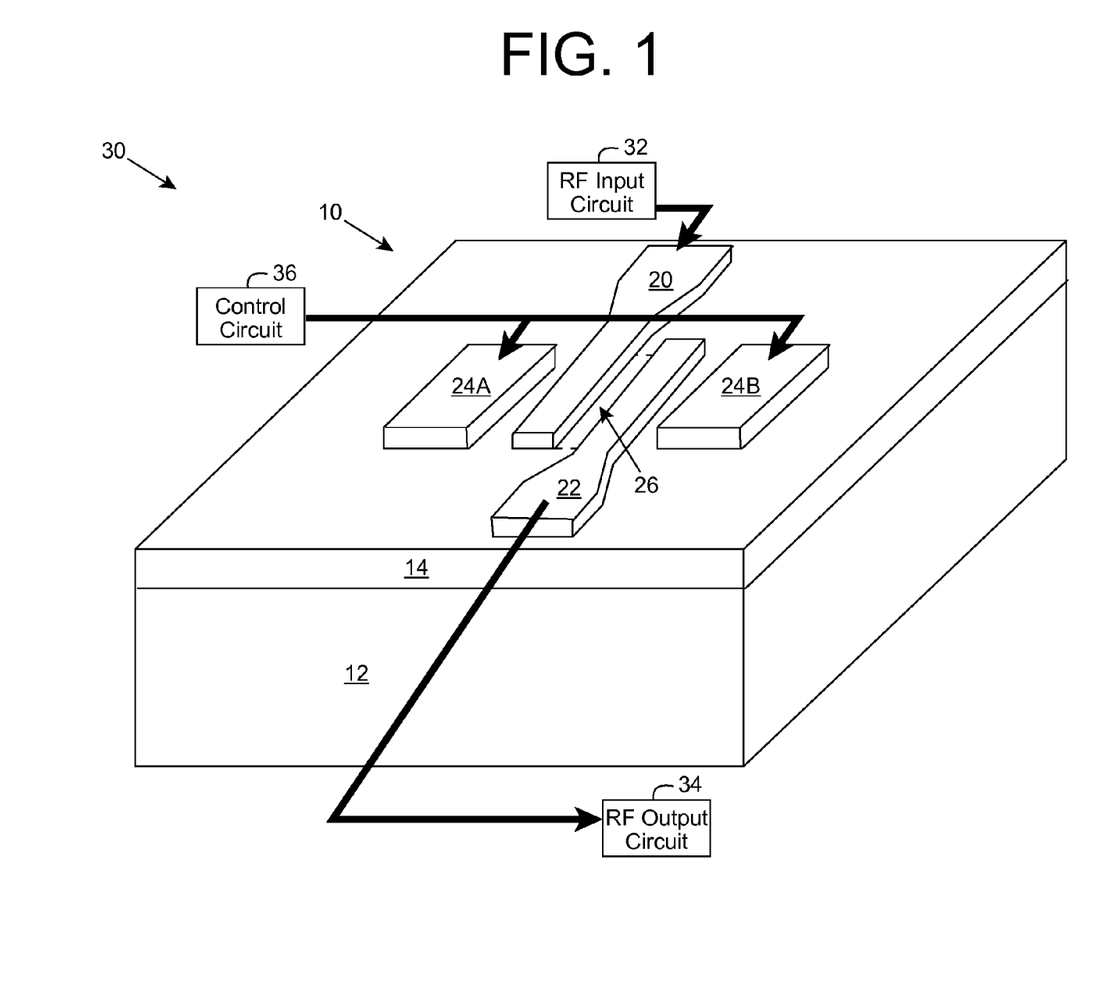
FIG. 1 shows an illustrative gateless switch and an illustrative circuit including the switch according to an embodiment.

Turning to the drawings, FIG. 1 shows an illustrative gateless switch 10 according to an embodiment. As illustrated, switch 10 includes a substrate 12 on which a conducting channel 14 is located. Substrate 12 can comprise any type of substrate, such as sapphire, substrate materials with a low dielectric permittivity, or the like.

As described further herein, channel 14 can be formed using any type of elementary or compound semiconductor material system. In an embodiment, channel 14 comprises a heterostructure channel formed at an interface of a barrier layer comprising a wide band gap and a buffer layer comprising a band gap that is narrower than the band gap of the barrier layer. For example, channel 14 can be formed using compound semiconductor heterostructures including two or more layers of materials selected from the group-III nitride material system (e.g., $Al_X In_Y Ga_{1-X-Y} N$, where $0 \leq X$, $Y \leq 1$, and $X+Y \leq 1$ and/or alloys thereof), two or more layers of materials selected from the group-III arsenide material system (e.g., $Al_X Ga_{1-X} As$, where $0 \leq X \leq 1$, and/or alloys thereof), two or more layers of materials selected from the InGaP material system (e.g., $In_X Ga_{1-X} P$, where $0 \leq X \leq 1$, and/or alloys thereof), and/or the like. Additionally, the channel 14 can be formed by n- or p-doped layers of silicon, germanium, or any other type of semiconductor materials.

Switch 10 further includes an input contact 20 and an output contact 22. Each contact 20, 22 can comprise a layer of metal, such as for example, titanium, aluminum, nickel, gold, and/or the like. One or both contacts 20, 22 can comprise a capacitively coupled contact, which comprises a metal contact 20, 22 capacitively coupled to the conducting channel 14. To this extent, an insulating layer can be located between the metal layer of the contact 20, 22 and the channel 14. The insulating layer can comprise any type of insulating material, such as a dielectric. For example, the insulating material can include oxygen containing dielectric materials (e.g., $SiO_2$, $HfO_2$, or the like), nitrogen containing dielectric materials, such as a SiN compound (e.g., SiN, $Si_3N_4$), and/or the like. In an embodiment, a capacitively coupled contact 20, 22 comprises a multi-layered contact, which includes an insulating layer located over the conducting channel 14 and a metal layer located over the insulating layer. However, an insulating layer can be formed using any solution. For example, a semiconductor material on which contacts 20, 22 are formed can include a depletion region over which the contacts 20, 22 are located. Alternatively, a highly resistive semiconductor material can form the insulating layer. Furthermore, the insulating layer can be formed by an air gap between the contacts 20, 22 and the semiconductor structure including channel 14.

Switch 10 also includes at least one control contact, such as control contacts 24A, 24B. Each control contact 24A, 24B is located outside of an input-output region 26 defined by adjacent sides of contacts 20, 22, making switch 10 a gateless switch. A control contact 24A, 24B can comprise any type of contact having a strong coupling (ohmic or capacitive) with the conducting channel 14. To this extent, an illustrative control contact 24A, 24B can comprise a capacitively coupled contact to the channel 14, which can be configured similar to contacts 20, 22 as shown and described herein. Alternatively, an illustrative control contact 24A, 24B can comprise an ohmic contact to the channel 14. The ohmic contact can comprise a metal layer (e.g., titanium, aluminum, nickel, gold, and/or the like). In an embodiment, the ohmic contact further includes a contact layer on which the metal layer is formed. The contact layer can comprise at least Al and In. For example, the contact layer can comprise a p-type semiconductor and substantially consists of Al, In, Ga, and N.

In an embodiment, switch 10 operates as a radio frequency (RF) switch in which input contact 20 is a RF input contact and output contact 22 is a RF output contact in an integrated high power semiconductor device circuit 30. Circuit 30 can be implemented as part of a semiconductor device configured to implement any type of application, including but not limited to, a radar, a detector, a power amplifier, a rectifier, a wireless communication unit, any type of power converter, and/or the like.

Circuit 30 is shown including a RF input circuit 32, which generates a RF signal and transmits the RF signal to input contact 20. When switch 10 is operating in the on state, the RF signal is transmitted from input contact 20 to output contact 22 via conducting channel 14, and is further transmitted to a RF output circuit 34 included in circuit 30. In an embodiment, input contact 20 is monolithically integrated with an input transmission line from RF input circuit 32, and output contact 22 is monolithically integrated with an output transmission line to RF output circuit 34. Control circuit 36 is electrically connected to one or more of the control contact(s) 24A, 24B and is configured to turn switch 10 on and off using the control contacts(s) 24A, 24B.

In an embodiment, control circuit 36 modulates the operating state of switch 10, and the transmission between contacts 20, 22, electro-statically. To this extent, control circuit 36 can apply a voltage bias to one or both control contacts 24A, 24B, which modulates a depletion region under one or both contacts 20, 22. As a result, an input-output impedance for switch 10 is also adjusted.

Figure 2:
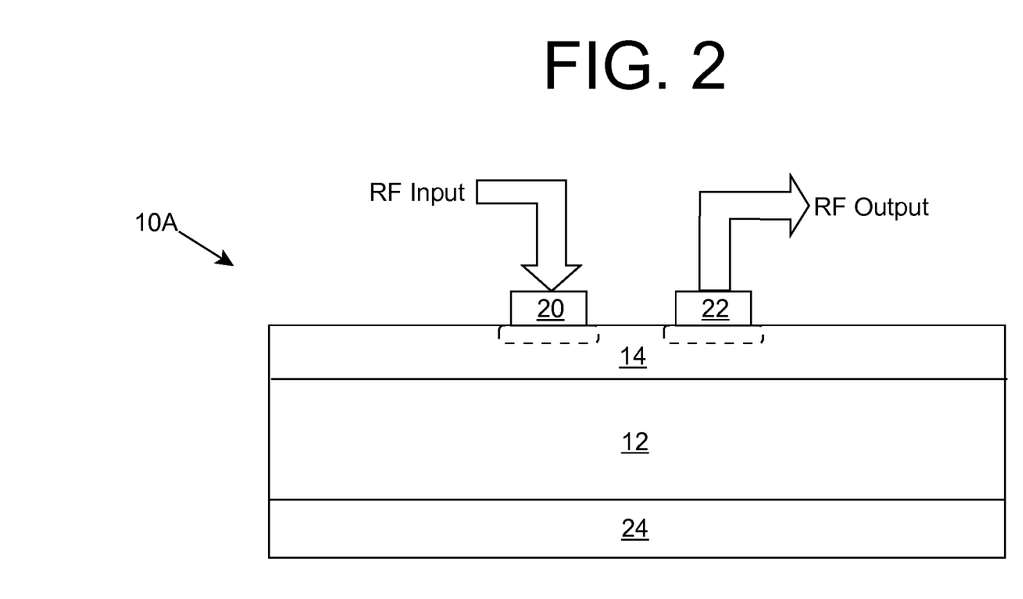
FIG. 2 shows a cross section of an illustrative switch with a control contact located on an opposing side of the conducting channel from the input and output contacts according to an embodiment.

While switch 10 is shown including two control contacts 24A, 24B located on a surface of switch 10 adjacent to contacts 20, 22, respectively, it is understood that control contact(s) 24A, 24B can be located anywhere on switch 10 outside of region 26. For example, control contact(s) 24A, 24B can be located on an opposing side of channel 14 from contacts 20, 22. To this extent, FIG. 2 shows a cross section of an illustrative switch 10A with a control contact 24 located on an opposing side of the conducting channel 14 from the input contact 20 and output contact 22 according to an embodiment. As illustrated, a single control contact 24 can be located below substrate 12. In another embodiment, substrate 12 can comprise a conducting substrate, such as SiC, GaN, and/or the like, which can be configured to function as a control contact as described herein.

Figure 3A:
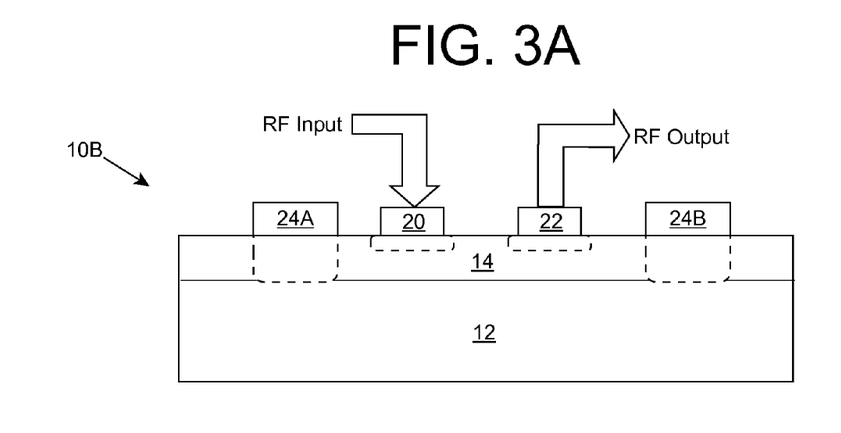
FIGS. 3A and 3B show a cross section of an illustrative switch in the on state and off state, respectively, according to an embodiment.
Figure 3B:
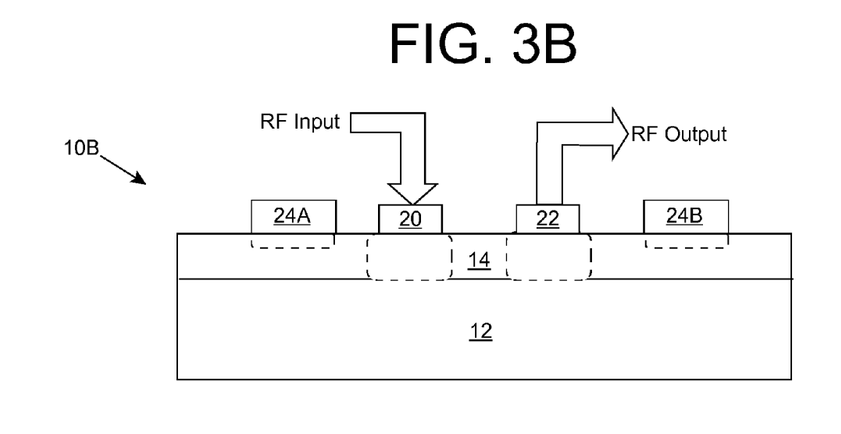

FIGS. 3A and 3B show a cross section of an illustrative switch 10B in the on state and off state, respectively, according to an embodiment. Switch 10B is implemented with capacitively coupled control contacts 24A, 24B. The dashed areas under the contacts 20, 22, 24A, 24B indicate depletion regions. The length and the width of the depletion regions under the input contact 20 and output contact 22 increase as a reverse bias voltage between the contacts 20, 22 and the channel 14 increases. The bias voltage (electrical potential difference) is supplied by control contacts 24A, 24B located outside the input-output region 26 (FIG. 1).

In the on state shown in FIG. 3A, control contacts 24A, 24B can supply a zero or forward voltage bias between the control contacts 24A, 24B and contacts 20, 22, which generates the corresponding depletion regions under the respective contacts 20, 22, 24A, 24B. In particular, a reverse bias voltage can be applied to control contacts 24A, 24B. In this case, the depletion regions under control contacts 24A, 24B extend such that the channel 14 disappears under control contacts 24A, 24B. However, contacts 20, 22 are forward biased. As a result, the depletion regions under contacts 20, 22, are relatively small, allowing the signal to pass from input contact 20 to output contact 22.

In the off state shown in FIG. 3B, a forward bias voltage applied to the control contacts 24A, 24B reverse-biases the contacts 20, 22 beyond the pinch-off voltage of the portions of the channel 14 under contacts 20, 22. In particular, since contacts 20, 22 are capacitively coupled to channel 14, the reverse voltage bias applied between the input contact 20 and the channel 14 and between the output contact 22 and the channel 14 generates a depletion region under each of the contacts 20, 22. As the depletion region extends such that the conducting channel 14 under the contact 20, 22 disappears as shown in FIG. 3B, the switch 10B enters a pinched-off mode and the conductance between the contacts 20, 22 becomes very small.

Figure 4A:
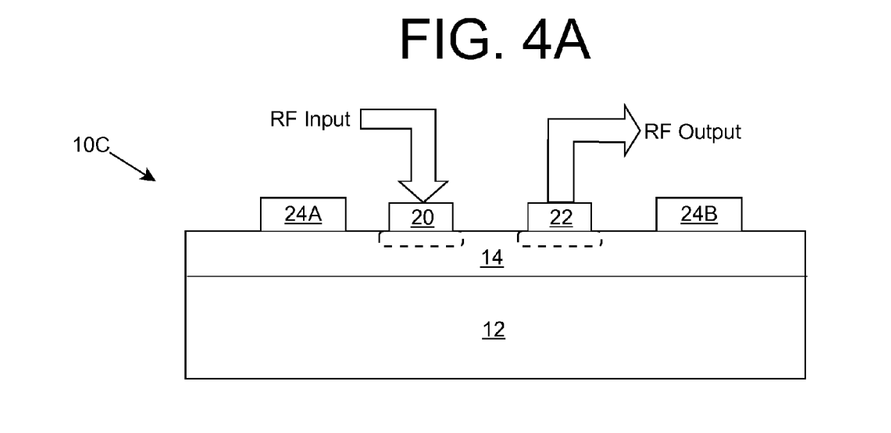
FIGS. 4A and 4B show a cross section of another illustrative switch in the on state and off state, respectively, according to an embodiment.
Figure 4B:
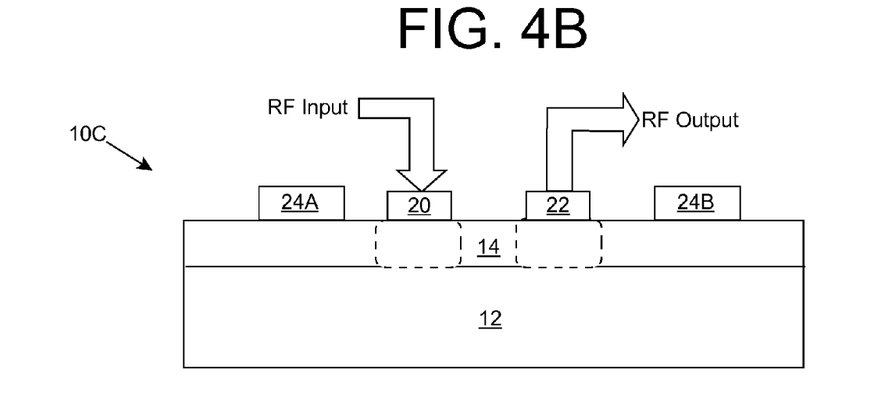

FIGS. 4A and 4B show a cross section of another illustrative switch 100 in the on state and off state, respectively, according to an embodiment. Switch 100 is implemented with ohmic control contacts 24A, 24B. The dashed areas under the contacts 20, 22 indicate depletion regions. Similar to operation of switch 10B shown in FIGS. 3A, 3B, the length and the width of the depletion regions under the input contact 20 and output contact 22 increase as a reverse bias voltage between the contacts 20, 22 and the channel 14 increases. The bias voltage is supplied by control contacts 24A, 24B located outside the input-output region 26 (FIG. 1).

The required voltage bias between contacts 20, 22 and channel 14 to turn the switch off can vary based on the materials used to fabricate contacts 20, 22 and channel 14. For example, for a typical heterostructure channel 14 formed by a group III-nitride material, a voltage bias between approximately 3-8 volts may be required, while a typical heterostructure channel 14 formed by a AlGaAs- or InP-based material may require a voltage bias between approximately 1-3 volts. To obtain the necessary voltage bias using the capacitive control contacts 24A, 24B shown and described with reference to FIGS. 3A and 3B, a voltage bias up to approximately twice the required voltage bias to turn the switch off may need to be applied to control contacts 24A, 24B due to additional voltage across the control contacts 24A, 24B capacitance. However, the ohmic control contacts 24A, 24B shown and described with reference to FIGS. 4A and 4B can require a bias voltage approximately the same as the voltage bias required to turn the switch off.

Figure 5:
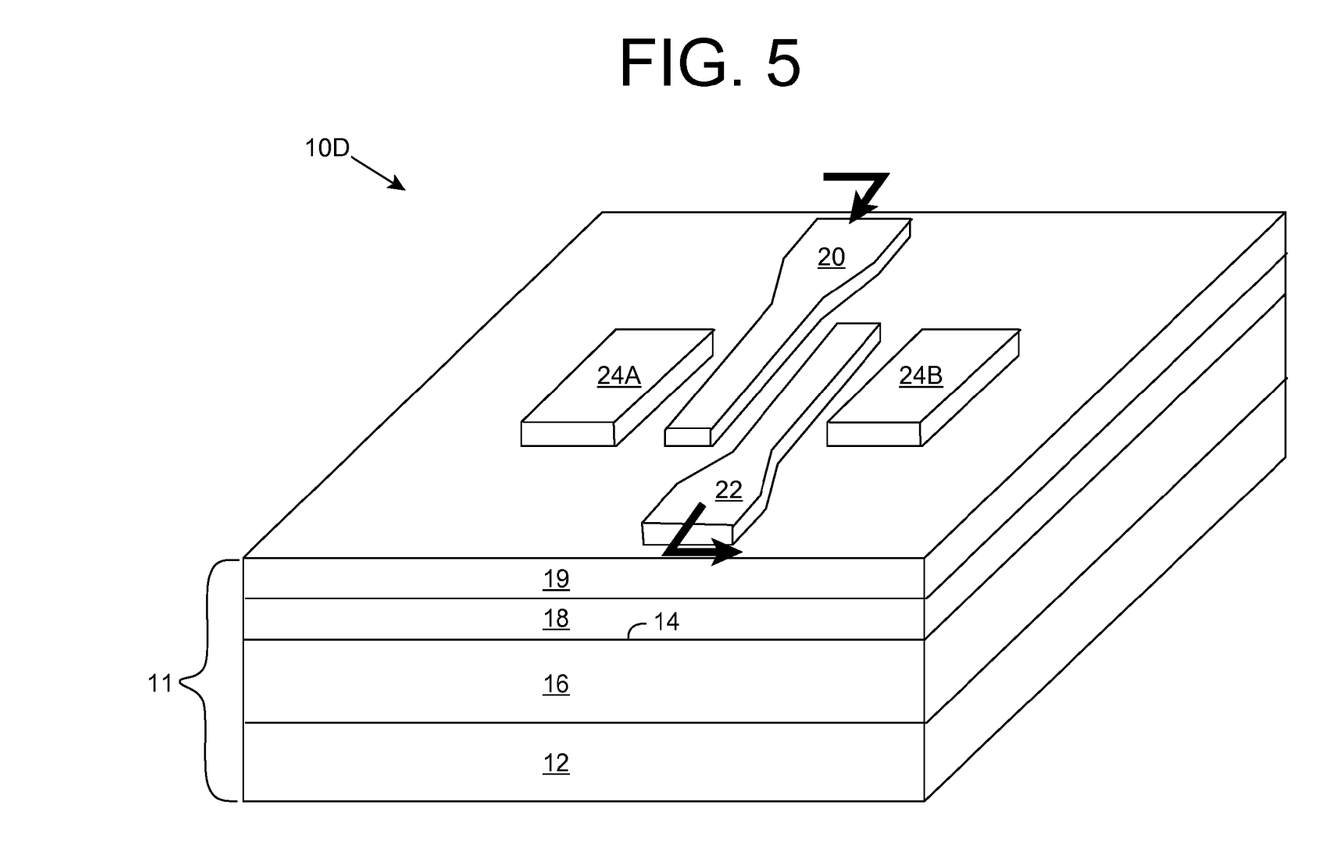
FIG. 5 shows an illustrative switch implemented using a heterostructure switch technology according to an embodiment.

As discussed herein, the illustrative switches shown and described herein can be manufactured using any of various material systems and technologies. To this extent, FIG. 5 shows an illustrative switch 10D implemented using a heterostructure switch technology according to an embodiment. Switch 10D comprises a heterostructure 11 that includes a substrate 12 on which a buffer layer 16 is located. Further, the heterostructure 11 includes a barrier layer 18 located on the buffer layer 16. A heterostructure channel 14 is formed at an interface of the barrier layer 18 and the buffer layer 16. To this extent, the barrier layer 18 comprises a wide band gap and the buffer layer 16 comprises a band gap that is narrower than the barrier layer 18. Substrate 12 can comprise any type of substrate, such as sapphire, highly resistive silicon, gallium arsenide, SiC, other semiconductor materials, dielectric materials (e.g., diamond), or the like. Buffer layer 16 can be formed using GaN and barrier layer 18 can be formed using AlGaN. Alternatively, buffer layer 16 can be formed using GaAs and barrier layer 18 can be formed using AlGaAs.

Additionally, heterostructure 11 can include an insulating layer 19 located on the barrier layer 18 thereby forming an insulator/semiconductor compound heterostructure. Insulating layer 19 can comprise any type of insulating material, such as a dielectric. To this extent, the insulating material can comprise, for example, oxygen containing dielectric materials (e.g., $SiO_2$, $HfO_2$, or the like). Insulating layer 19 can decrease a capacitance of switch 10D and an amount of leakage current during operation of switch 10D. Further, insulating layer 19 can enable switch 10D to be operated at higher voltages. Additionally, when insulating layer 19 is included, the capacitively coupled contact(s) can comprise only a metal layer.

It is understood that heterostructure 11 is only illustrative of various heterostructures that can be utilized to manufacture a switch. For example, heterostructure 11 can comprise an inverted heterostructure, a metal-semiconductor heterostructure, a doped channel metal-semiconductor heterostructure, a metal oxide semiconductor heterostructure, a metal insulator semiconductor heterostructure, a doped channel metal-insulator-semiconductor heterostructure, a double heterostructure, and/or the like.

In an illustrative embodiment, the switch described herein is configured to provide a lower channel resistance, which can enable the switch to achieve lower loss, higher isolation, or both depending on a layout of a circuit in which the switch is implemented. For example, the switch can include more than one conducting channel 14. The conducting channels 14 can be formed by a heterostructure. To this extent, the heterostructure can comprise a double heterostructure channel formed inside a quantum well of narrower band gap materials placed between wide band gap barrier layers. Further, the channel(s) of an embodiment of the switch described herein can be doped with impurities, thereby increasing an equilibrium carrier concentration in the channel 14, e.g., donors for a n-type channel or acceptors for a p-type channel.

Figure 6A:
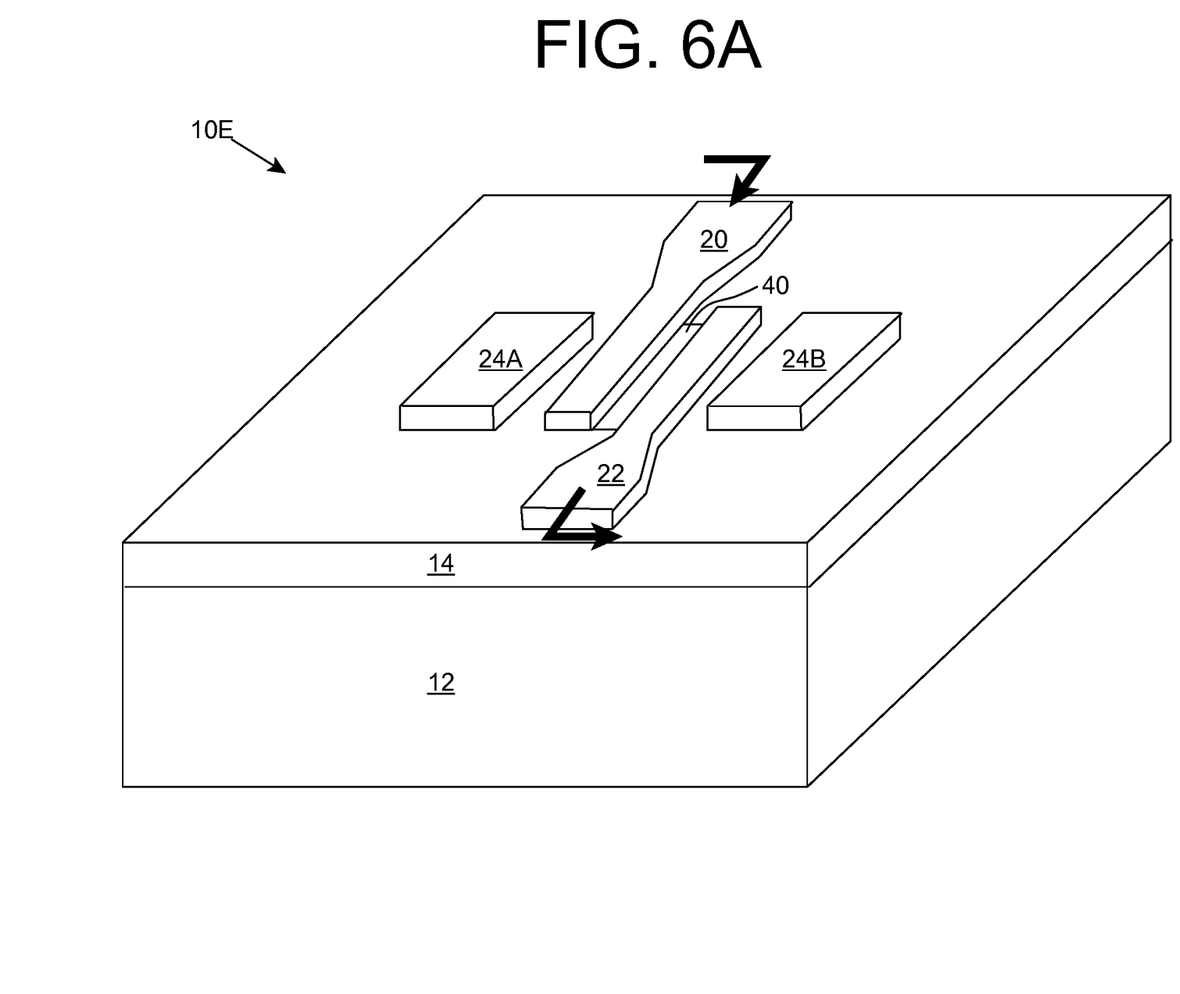
FIGS. 6A and 6B show illustrative switches including one or more low conducting layers between the contacts according to embodiments.
Figure 6B:
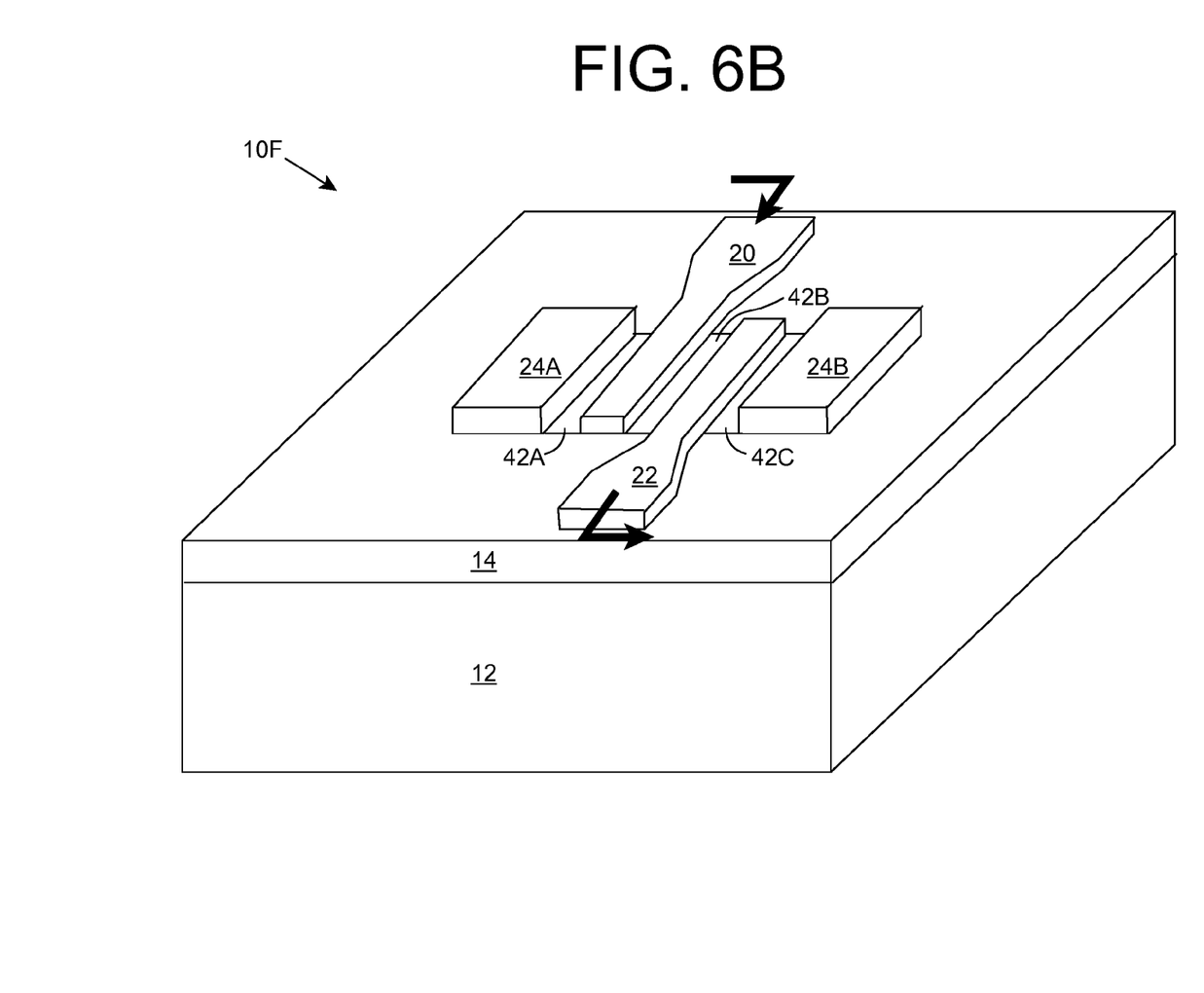

Embodiments of the switch shown and described herein can include one or more additional layers. For example, FIGS. 6A and 6B show illustrative switches 10E, 10F, respectively, including one or more low conducting layers between the contacts according to embodiments. The low conducting layer(s) can be formed using a material such as a semiconductor, a dielectric, a polymer, a liquid, and/or the like. In FIG. 6A, switch 10E includes a low-conducting layer 40 located in the input-output region 26 (FIG. 1). Low-conducting layer 40 can be formed (e.g., deposited) on the surface of the switch 10E between input contact 20 and output contact 22. Low-conducting layer 40 can make electrical contact with both contacts 20, 22.

The steady-state potential at low-conducting layer 40 is the same as that at the contacts 20, 22. Therefore, if the portions of the channel 14 under the contacts 20, 22 are in the pinch-off condition, so is the portion of the channel 14 under the low-conducting layer 40. As a result, the entire channel 14 in the RF input-RF output spacing is depleted resulting in very low input-output capacitance. When the contacts 20, 22 are at zero or positive potential, the entire channel 14 in the RF input-RF output spacing is un-depleted.

In FIG. 6B, switch 10F includes three low-conducting layers 42A-42C. Low-conducting layer 42A is located between control contact 24A and input contact 20, low-conducting layer 42B is located between input contact 20 and output contact 22, and low-conducting layer 42C is located between output contact 22 and control contact 24B. Each conducting layer 42A-42C can make electrical contact with both of the corresponding adjacent contacts. In addition to depleting the entire channel 14, low-conducting layers 42A-42C also can reduce the capacitance between the contacts 20, 22 and the control contacts 24A, 24B.

Figure 7:
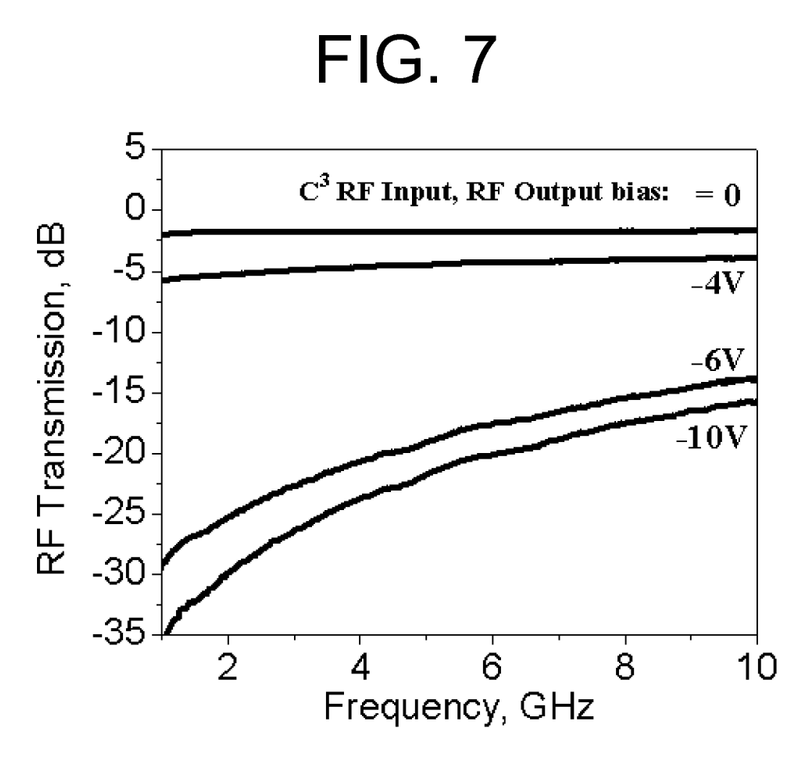
FIG. 7 shows RF transmission of an illustrative switch manufactured using capacitively coupled contacts for the input contact, output contact, and both control contacts according to an embodiment.

FIG. 7 shows RF transmission of an illustrative switch manufactured using the capacitively coupled contacts for the input contact, output contact, and both control contacts according to an embodiment. As illustrated, at a zero or negative voltage bias at the control contacts, the switch is in the on state. At a negative voltage bias at the input and output contacts (a positive bias at the control contacts), the switch is in the off state. In the off state, the conducting channel between the input and output contacts disappears, and the RF coupling between the input and output contacts is only provided by small edge capacitances of the contacts to the channel between the contacts (e.g., below input-output spacing 26 of FIG. 1). When a low-conducting layer is included between the input and output contacts, the capacitance further reduces down to a geometrical capacitance between the two metal electrodes (typically less than 0.1 picofarad/millimeter (pF/mm).

While primarily shown and described herein as a switch and a corresponding circuit, it is understood that aspects of the invention further provide various alternative embodiments. In one embodiment, the invention provides a method of fabricating (manufacturing) a switch described herein. For example, a structure capable of forming one or more conducting channels, such as a heterostructure 11 (FIG. 5), can be obtained using any solution. The structure can be purchased or otherwise acquired, fabricated (e.g., by growing or depositing layer(s) in the heterostructure), or the like. The various contacts 20, 22, 24A, 24B can be formed on a surface of the structure. For example, a metal for each contact 20, 22, 24A, 24B can be deposited and/or shaped using any solution. By forming contacts 24A, 24B outside of the input-output region 26, fabrication of the switch is simplified.

In another embodiment, the invention provides a method of fabricating a circuit, such as circuit 30 of FIG. 1, including the switch described herein. For example, input contact 20 can be electrically connected to a conductor (e.g., transmission line) carrying an RF signal from a RF input circuit 32, and output contact 22 can be electrically connected to a conductor carrying the RF signal to a RF output circuit 34. In an embodiment, the electrical connections are made by monolithically integrating the contacts 20, 22 with the conductors. Further, control contacts 24A, 24B can be electrically connected to a control circuit 36, which generates a control signal for switching the operating state of the switch 10 between on and off states.

In still another embodiment, the invention provides a method of operating a device including the RF switch 10. In particular, the method includes selectively enabling a RF signal to pass from a RF input circuit 32 to a RF output circuit 34 electro-statically, e.g., by modulating depletion regions under an input contact 20 and an output contact 22, which adjusts an impedance for the switch. For example, the switch can be transitioned between on and off operating states by applying a bias voltage to control contact(s) 24A, 24B located outside of the input-output region 26.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A switch comprising:
   a conducting channel;
   an input contact to the conducting channel;
   an output contact to the conducting channel, wherein the input contact and the output contact form opposing sides of an input-output region, and wherein at least one of the input contact or the output contact is capacitively coupled to the conducting channel; and
   at least one control contact located outside of the input-output region, wherein the at least one control contact includes a first control contact located adjacent to the input contact and a second control contact located adjacent to the output contact.

2. The switch of claim 1, wherein the at least one control contact is capacitively coupled to the conducting channel.

3. The switch of claim 1, wherein the at least one control contact is an ohmic contact to the conducting channel.

4. The switch of claim 1, wherein the at least one control contact is located on an opposing side of the conducting channel from the input contact and the output contact.

5. The switch of claim 4, wherein the at least one control contact comprises a conducting substrate.

6. The switch of claim 1, further comprising:
a barrier layer comprising a wide band gap, wherein the input contact and the output contact are located over the barrier layer; and
a buffer layer comprising a band gap narrower than the barrier layer, wherein the conducting channel is formed at an interface of the barrier layer and the buffer layer.

7. The switch of claim 6, further comprising an insulating layer located over the barrier layer, wherein the input contact and the output contact are located over the insulating layer.

8. The switch of claim 1, further comprising an insulating layer located in the input-output region, wherein the insulating layer is electrically connected to the input contact and the output contact.

9. The switch of claim 1, wherein the conducting channel is doped with impurities.

10. A switch comprising:
a conducting channel;
an input contact to the conducting channel;
an output contact to the conducting channel, wherein the input contact and the output contact form opposing sides of an input-output region, and wherein at least one of the input contact or the output contact is capacitively coupled to the conducting channel;
an insulating layer located in the input-output region, wherein the insulating layer is electrically connected to the input contact and the output contact;
at least one control contact located outside of the input-output region; and
a second insulating layer located between the input contact and one of the at least one control contact and a third insulating layer located between the output contact and another one of the at least one control contact.

11. A switch comprising:
a conducting channel;
an input contact to the conducting channel;
an output contact to the conducting channel, wherein the input contact and the output contact form opposing sides of an input-output region, and wherein at least one of the input contact or the output contact is capacitively coupled to the conducting channel;
at least one control contact located outside of the input-output region; and
a second conducting channel, wherein the input contact, the output contact and the at least one control contact are coupled to the second conducting channel, and wherein at least one of the input contact or the output contact is capacitively coupled to the second conducting channel.

12. A circuit comprising:
a radio frequency (RF) switch including:
a conducting channel;
an input contact to the conducting channel;
an output contact to the conducting channel, wherein the input contact and the output contact form opposing sides of an input-output region, and wherein at least one of the input contact or the output contact is capacitively coupled to the conducting channel; and
at least one control contact located outside of the input-output region, wherein the at least one control contact is an ohmic contact to the conducting channel;
a RF source electrically connected to the input contact;
a RF output electrically connected to the output contact; and
a RF control circuit electrically connected to the at least one control contact.

13. The circuit of claim 12, wherein the RF control circuit is configured to turn the RF switch off by generating a reverse voltage bias at the input and output contacts with respect to the conducting channel using the at least one control contact.

14. The circuit of claim 12, wherein the RF control circuit is configured to turn the RF switch on by generating one of: a zero voltage or a forward voltage bias at the input and output contacts with respect to the conducting channel using the at least one control contact.

15. The circuit of claim 12, wherein the input contact is monolithically integrated with the RF input and the output contact is monolithically integrated with the RF output.

16. The circuit of claim 12, wherein the switch further includes an insulating layer located in the input-output region, wherein the insulating layer is electrically connected to the input contact and the output contact.

17. A switch comprising:
a barrier layer comprising a wide band gap; and
a buffer layer comprising a band gap narrower than the barrier layer, wherein a conducting channel is formed at an interface of the barrier layer and the buffer layer, and wherein the conducting channel is doped with impurities;
an input contact to the conducting channel;
an output contact to the conducting channel, wherein the input contact and the output contact form opposing sides of an input-output region, wherein the input contact and the output contact are located over the barrier layer, and wherein the input contact and the output contact are capacitively coupled to the conducting channel; and
at least one control contact located outside of the input-output region.

18. The switch of claim 17, further comprising an insulating layer located over the barrier layer, wherein the input contact and the output contact are located over the insulating layer.

19. The switch of claim 17, further comprising an insulating layer located in the input-output region, wherein the insulating layer is electrically connected to the input contact and the output contact.

20. The switch of claim 17, wherein the at least one control contact includes a first control contact located adjacent to the input contact on a side opposite the output contact and a second control contact located adjacent to the output contact on a side opposite the input contact.

* * * * *